(12) United States Patent
Inaoka

(10) Patent No.: US 7,825,078 B2
(45) Date of Patent: Nov. 2, 2010

(54) NON-AQUEOUS MICROELECTRONIC CLEANING COMPOSITIONS CONTAINING FRUCTOSE

(75) Inventor: Seiji Inaoka, Nazareth, PA (US)

(73) Assignee: Mallinckrodt Baker, Inc., Phillipsburg, NJ (US)

( * ) Notice: Subject to any disclaimer, the term of this patent is extended or adjusted under 35 U.S.C. 154(b) by 121 days.

(21) Appl. No.: 11/630,602

(22) PCT Filed: Feb. 1, 2005

(86) PCT No.: PCT/US2005/003422

§ 371 (c)(1),
(2), (4) Date: Dec. 20, 2006

(87) PCT Pub. No.: WO2006/019402

PCT Pub. Date: Feb. 23, 2006

(65) Prior Publication Data

US 2008/0287333 A1    Nov. 20, 2008

(51) Int. Cl.
*C11D 7/26* (2006.01)
*C11D 7/32* (2006.01)
*C11D 7/34* (2006.01)
*C11D 7/50* (2006.01)

(52) U.S. Cl. ............ 510/176; 510/175; 510/245; 510/255; 510/265; 510/266; 510/493; 510/499; 510/500; 510/501

(58) Field of Classification Search .......... 510/175, 510/176, 245, 255, 265, 266, 493, 499, 500, 510/501; 134/1.3
See application file for complete search history.

(56) References Cited

U.S. PATENT DOCUMENTS

| 5,567,574 | A  | 10/1996 | Hasemi et al. |
| 6,140,027 | A  | 10/2000 | Baik et al. |
| 6,440,326 | B1 | 8/2002  | Maruyama et al. |
| 6,638,694 | B2 | 10/2003 | Ikemoto et al. |
| 2003/0186175 | A1 | 10/2003 | Ikemoto et al. |

FOREIGN PATENT DOCUMENTS

| EP | 0647884 | 4/1995 |
| EP | 1347339 | 9/2003 |
| WO | WO 03/007085 | 1/2003 |

*Primary Examiner*—Gregory R Del Cotto
(74) *Attorney, Agent, or Firm*—Ohlandt, Greeley, Ruggiero & Perle, LLP; George W. Rauchfuss, Jr.

(57) ABSTRACT

Back end photoresist strippers and residue compositions are provided by non-aqueous compositions that are essentially non-corrosive toward copper as well as aluminum and that comprise a polar organic solvent, a hydroxylated amine, and as a corrosion inhibitor fructose.

6 Claims, No Drawings

NON-AQUEOUS MICROELECTRONIC CLEANING COMPOSITIONS CONTAINING FRUCTOSE

RELATED APPLICATIONS

This Application is a United States National Stage Application of PCT Application No. PCT/US2005/003422, filed Feb. 1, 2005, and claims priority from U.S. Provisional Application No. 60/588,248, filed Jul. 15, 2004.

FIELD OF THE INVENTION

This invention relates to methods and non-aqueous cleaning compositions for cleaning microelectronic substrates, and particularly to such cleaning compositions useful with and having improved compatibility with microelectronic substrates characterized by copper metallization. The invention also relates to the use of such cleaning compositions for stripping photoresists, and cleaning residues from plasma process generated organic, organometallic and inorganic compounds.

BACKGROUND TO THE INVENTION

Many photoresist strippers and residue removers have been proposed for use in the microelectronics field as downstream or back end of the manufacturing-line cleaners. In the manufacturing process a thin film of photoresist is deposited on a wafer substrate, and then circuit design is imaged on the thin film. Following baking, the unpolymerized resist is removed with a photoresist developer. The resulting image is then transferred to the underlying material, which is generally a dielectric or metal, by way of reactive plasma etch gases or chemical etchant solutions. The etch gases or chemical etchant solutions selectively attack the photoresist-unprotected area of the substrate.

Additionally, following the termination of the etching step, the resist mask must be removed from the protected area of the wafer so that the final finishing operation can take place. This can be accomplished in a plasma ashing step by the use of suitable plasma ashing gases or wet chemical strippers. Finding a suitable cleaning composition for removal of this resist mask material without adversely affecting, e.g., corroding, dissolving or dulling, the metal circuitry has also proven problematic.

As microelectronic fabrication integration levels have increased and patterned microelectonic device dimensions have decreased towards the size of atoms, and the heat formed as current passes through the circuits have become a serious problem. It has become Increasingly common in the art to employ copper metallizations as the conductor material, instead of aluminum, since copper is more beneficial in reducing the heat formation. These copper containing microelectronic materials have presented additional challenges to find acceptable cleaner compositions. Many process technology compositions that have been previously developed for "traditional" or "conventional" semiconductor devices containing Al/SiO$_2$ or Al (Cu)/SiO$_2$ structures cannot be employed with copper metallized structures. For example, hydroxylamine based stripper or residue remover compositions are successfully used for cleaning devices with Al metallizations, but are practically unsuitable for those with copper metallizations. Similarly, many copper metallized are not suitable for Al metallized devices unless significant adjustments in the compositions are made.

Removal of these etch and/or ash residues following the plasma etch and/or ashing process for such copper and aluminum metallized microelectronic structures has proved problematic, particularly for substrates metallized with copper. Failure to completely remove or neutralize these residues can result in the absorption of moisture and the formation of undesirable materials that can cause corrosion to the metal structures. The circuitry materials are corroded by the undesirable materials and produce discontinuances in the circuitry wiring and undesirable increases in electrical resistance.

Heretofore, photoresist strippers have often contained amines since they generally show superior cleaning performance in attacking hardened photoresist and in the ability to strip such hardened photoresist from the surface of the microelectronic substrates. However, copper is generally also severely attacked by amines and significant metal corrosion can occur if such a conventional photoresist stripper is utilized without modification. Therefore, it is highly desirable to provide a copper compatible photoresist stripper or cleaner for use in the microelectronics industry, particularly for copper metallized materials. It is also highly desirable to provide a copper compatible photoresist stripper or cleaner for use in the microelectronics industry, particularly for copper metallized materials, that is also compatible for use with aluminum metallized materials. Since the same shift in technology from aluminum to copper metallization is being seen in the development of flat panel displays, it is also desirable to provide a stripper/cleaner that can be use in producing such flat panel displays.

BRIEF SUMMARY OF THE INVENTION

Back end photoresist strippers and cleaning compositions of this invention are provided by non-aqueous compositions that are essentially non-corrosive toward copper as well as aluminum and that comprise a polar organic solvent, a hydroxylated amine, and as a corrosion inhibitor fructose. The compositions of this invention may also contain a number of other optional components. The cleaning compositions of this invention can be used over a wide range of process/operating conditions of pH and temperature, and can be used to effectively remove photoresists, post plasma etch/ash residues, sacrificial light absorbing materials and anti-reflective coatings (ARC). Additionally, it has been discovered that very difficult to clean samples, such as highly crosslinked or hardened photoresists and structures which contain titanium (such as titanium, titanium oxide and titanium nitride) or tantalums (such as tantalum, tantalum oxide and tantalum nitride) can be readily cleaned with the cleaning compositions of this invention.

The non-aqueous, essentially non-corrosive microelectronic stripper/cleaner compositions of this invention will generally comprise from about 70% to about 95% of the organic polar solvent, from about 1% to about 15% of the organic hydroxylated amine, and a corrosion-inhibiting amount of the fructose corrosion inhibitor, generally from about 0.1% to about 15% of the fructose. The wt percentages provided in this specification are based on the total weight of the cleaning composition.

The non-aqueous, essentially non-corrosive stripping/cleaning compositions of this invention can also optionally contain other compatible components, including but not limited to components such as chelating agents, organic hydroxyl-containing co-solvents, stabilizing and metal chelating or complexing agents, other metal corrosion inhibitors, and surfactants.

DETAILED DESCRIPTION OF INVENTION AND PREFERRED EMBODIMENTS

Back end photoresist strippers and cleaning compositions of this invention are provided by non-aqueous compositions that are essentially non-corrosive toward copper as well as aluminum and that comprise a polar organic solvent, an organic hydroxylated amine, and as a corrosion inhibitor fructose. The compositions of this Invention may also contain a number of other optional components.

The cleaning compositions of this invention can be used over a wide range of process/operating conditions of pH and temperature, and can be used to effectively remove photoresists, post plasma etch/ash residues, sacrificial light absorbing materials and anti-reflective coatings (ARC). Additionally, it has been discovered that very difficult to clean samples, such as highly crosslinked or hardened photoresists and structures which contain titanium (such as titanium, titanium oxide and titanium nitride) or tantalums (such as tantalum, tantalum oxide and tantalum nitride) can be readily cleaned with the cleaning compositions of this invention.

The non-aqueous, essentially non-corrosive microelectronic stripper/cleaner compositions of this invention will generally comprise from about 70% to about 95%, preferably from about 75% to about 90%, and more preferably from about 80% to about 85%, of the organic polar solvent; from about 1% to about 15%, preferably from about 3% to about 12%, and more preferably from about 5% to about 10%, of the organic hydroxylated amine, and a corrosion-inhibiting amount of the fructose corrosion inhibitor, generally from about 0.1% to about 15%, preferably from about 1% to about 12%, and more preferably from about 3% to about 10%, of the fructose. The wt percentages provided in this specification are based on the total weight of the cleaning composition.

The compositions of this invention can contain one or more of any suitable organic polar solvent, preferably organic polar solvents that includes amides, sulfones, sulfoxides, saturated alcohols and the like. Such organic polar solvents include, but are not limited to, organic polar solvents such as sulfolane (tetrahydrothiopene-1,1-dioxide), 3-methylsulfolane, n-propyl sulfone, dimethyl sulfoxide (DMSO), methyl sulfone, n-butyl sulfone, 3-methylsulfolane, amides such as 1-(2-hydroxyethyl)-2-pyrrolidone (HEP), dimethylpiperidone (DMPD), N-methyl-2-pyrrolidone (NMP), dimethylacetamide (DMAc), and dimethylformamide (DMF) and mixtures thereof. Especially preferred as the organic polar solvent are N-methylpyrrolidone and sulfolane and mixtures of both of these two solvents.

The organic hydroxylated amine component may be one or more of any suitable hydroxylated, preferably hydroxylamine or an alkanolamine, preferably an alkanolamine. Suitable organic hydroxylated amine useful in the compositions of this invention include, but are not limited to hydroxylamine, monoethanolamine, diethanolamone, triethanolamine, and particularly 2-aminoethanol, 1-amino-2-propanol, 1-amino-3-propanol, 2-(2-aminoethoxy)ethanol, diethanolamine, 2-(2-aminoethylamino)ethanol, 2-(2-aminoethylamino)ethylamine and the like, and mixtures thereof. Most preferably the organic hydroxylated amine component is monoethanolamine, diethanolamine, triethanolamine and 1-amino-2-propanol and mixtures thereof.

The compositions of this invention may also optionally contain one or more of any suitable organic hydroxyl-containing co-solvent. Any suitable organic hydroxyl-containing co-solvent may be employed in the compositions of this invention. Examples of such suitable organic hydroxyl-containing co-solvents include, but are not limited to, ethylene glycol, propylene glycol, glycerol, and mono- and dialkyl ethers of diethylene glycol, known as Carbitol (2-(2-ethoxyethoxy)ethanol) and Carbitol derivatives, and saturated alcohols such as ethanol, propanol, butanol, hexanol, and hexafluoroisopropanol, and mixtures thereof. Especially preferred as a co-solvent is 2-(2-ethoxyethoxy)ethanol (Carbitol). A co-solvent may be present in the compositions of this invention in an amount, based on the total weight of the composition, of from 0 to about 30 wt %, preferably from about 0.1 to about 25 wt %, most preferably from about 0.5 to about 20 wt %.

The compositions of this invention may also contain one or more of any suitable other corrosion-inhibiting agents, preferably aryl compounds containing two or more OH, $OR_6$, and/or $SO_2R_6R_7$ groups bonded directly to the aromatic ring, where $R_6$, $R_7$ and $R_8$ are each independently alkyl, preferably alkyl of from 1 to 6 carbon atoms, or aryl, preferably aryl of from 6 to 14 carbon atoms. As examples of such preferred corrosion-inhibiting agents there may be mentioned catechol, pyrogallol, gallic acid, resorcinol and the like. Such other corrosion-inhibiting agents may be present in an amount of from 0 to about 15 wt %, preferably from about 0.1 to about 10 wt %, most preferably from about 0.5 to about 5 wt %.

Organic or inorganic chelating or metal complexing agents are not required, but offer substantial benefits, such as for example, improved product stability. One or more of such inorganic chelating or metal complexing agents may be employed in the compositions of this invention. Examples of suitable chelating or complexing agents include but are not limited to trans-1,2-cyclohexanediamine tetraacetic acid (CyDTA), ethylenediamine tetraacetic acid (EDTA), stannates, pyrophosphates, alkylidene-diphosphonic acid derivatives (e.g. ethane-1-hydroxy-1,1-diphosphonate), phosphonates containing ethylenediamine, diethylenetriamine or triethylenetetramine functional moieties [e,g. ethylenediamine tetra(methylene phosphonic acid) (EDTMP), diethylenetriamine penta(methylene phosphonic acid), and triethylenetetramine hexa(methylene phosphonic acid), and mixtures thereof. The chelating agent will be present in the composition in an amount of from 0 to about 5 wt %, preferably from about 0.1 to about 2 wt %. Metal chelating or complexing agents of various phosphonates, such as ethylenediamine tetra(methylene phosphonic acid) (EDTMP) offer much improved stabilization of the cleaning compositions of the cleaning compositions of this invention containing oxidizing agents at acidic and alkaline conditions and thus are generally preferred.

Optional: other metal corrosion inhibitors, such as benzotriazole, may be employed in an amount of from 0 to about 5 wt %, preferably from about 0.1 to 2 wt %.

The cleaning compositions optionally may also contain one or more suitable surfactants, such as for example dimethyl hexynol (Surfynol-61), ethoxylated tetramethyl decynediol (Surfynol-465), polytetrafluoroethylene cetoxypropylbetaine (Zonyl FSK), Zonyl FSH and the like. The surfactant will generally be present in an amount of from 0 to about 5 wt %, preferably 0.1 to about 3 wt %.

Example of cleaning compositions of this invention include, but are not limited to, the compositions set forth in the following Tables 1, 2 and 3. In Tables 1, 2 and 3 and the following Tables the abbreviations employed are as follows:

NMP=N-methylpyrrolidinone
SFL=sulfolane
DMSO=dimethyl sulfoxide

DMAC=dimethyacetamide
DMF=dimethformamide
EG=ethylene glycol
CAR=carbitol
TEA=triethanolamine
MEA=monoethanolamine
AMP=1-amino-2-propanol
FRT=fructose

TABLE 1

Compositions/Parts by Weight

| Components | 1 | 2 | 3 | 5 | 5 |
|---|---|---|---|---|---|
| NMP | 46.67 | 46.67 | 46.67 | 46.67 | 63.33 |
| SFL | 23.33 | 23.33 | 23.33 | 23.33 | 31.67 |
| DMSO | | | | | |
| DMAC | | | | | |
| DMF | | | | | |
| EG | | | | | |
| CAR | 20.00 | 20.00 | 20.00 | 20.00 | |
| TEA | | | 9.70 | 9.70 | |
| MEA | 10.00 | 10.00 | 0.30 | 0.30 | |
| AMP | | | | | 5.00 |
| FRT | 5.00 | 5.00 | 5.00 | 5.00 | 5.00 |

TABLE 2

Compositions/Parts by Weight

| Components | 6 | 7 | 8 | 9 | 10 |
|---|---|---|---|---|---|
| NMP | 60.00 | 46.66 | 51.33 | 90.00 | |
| SFL | 30.00 | 23.33 | 25.66 | | 90.00 |
| DMSO | | | | | |
| DMAC | | | | | |
| DMF | | | | | |
| EG | | | | | |
| CAR | | 20.00 | 20.00 | | |
| TEA | | | | | |
| MEA | | | | | |
| AMP | 10.00 | 10.00 | 5.00 | 10.00 | 10.00 |
| FRT | 5.00 | 5.00 | 5.00 | 5.00 | 5.00 |

TABLE 3

Compositions/Parts by Weight

| Components | 11 | 12 | 13 |
|---|---|---|---|
| NMP | 60.00 | 60.00 | 60.00 |
| SFL | | | |
| DMSO | 30.00 | | |
| DMAC | | 30.00 | |
| DMF | | | 30.00 |
| EG | | | |
| CAR | | | |
| TEA | | | |
| MEA | | | |
| AMP | 10.00 | 10.00 | 10.00 |
| FRT | 5.00 | 5.00 | 5.00 |

The anti-corrosion results obtained with the fructose containing cleaning compositions of this invention is by the following test results for a fructose containing compositions of this invention and the comparative test results for other saccharides.

A piece of copper-coated silicon wafer (approximately 20×20 mm) was prepared for the experiment. The piece was cleaned in a buffered oxide etch (which contains 35 w/w % NH4F and 6 w/w % HF for 1 minute, followed by rinsing in deionized water for 1 minute, and dried in nitrogen spray. Then the wafer piece was immersed in a 150 mL beaker that has 100 g of test solution in it, and the solution was heated at 60° C., stirred with a magnetic stirrer at 200 rpm and, 60 minutes later, the piece was removed from the test solution, rinsed with deionized water for 1 minute, and dried with nitrogen spray. The thickness of copper layer (before and after the experiment) was determined by the ResMap (manufactured by Creative Design Engineering, Sunnyvale, Calif.) 4-point probe system.

For the photoresist stripping experiment, the same test solutions were used at the same temperature (60° C.) with the same stirring rate (200 rpm). A piece of glass having positive photoresist layer (ca. 1000 angstroms) was immersed in the test solution and the time required for all of the resist stripped away was measured.

The test solutions (cleaning compositions) were the invention Composition 6 of Table 2 and comparative compositions where the 5.00 parts of fructose of Composition 6 was replaced with 5.00 parts of sucrose (Comparative Composition A), 5.00 parts glucose (Comparative Composition B), and 5.00 parts galactose (Comparative Composition C). The results of these etch rate and photoresist stripping tests for the compositions were as set forth in Table 4.

TABLE 4

| Composition | Cu Etch Rate (Å/min.) | Photoresist Stripping Performance (seconds required) |
|---|---|---|
| Comp. 6 of Table 2 | 2.3 | 10 |
| Comparative Comp. A | 62.9 | 7 |
| Comparative Comp. B | 4.0 | 8 |
| Comparative Comp. C | 4.9 | 7 |

While the invention has been described herein with reference to the specific embodiments thereof, it will be appreciated that changes, modification and variations can be made without departing from the spirit and scope of the inventive concept disclosed herein. Accordingly, it is intended to embrace all such changes, modification and variations that fall with the spirit and scope of the appended claims.

I claim:

1. A non-aqueous cleaning composition for cleaning photoresist, post etch and ash, sacrificial light absorbing materials or anti-reflective coatings from microelectronic substrates, said cleaning composition comprising:
   from about 70 wt % to about 95 wt % of organic polar solvent which is a mixture of N-methyl pyrrolidone and sulfolane, from about 1 wt % to about 15 wt % of an organic hydroxylated amine selected from the group consisting of diethanolamine and 1-amino-2-propanol, a corrosion-inhibiting amount of from about 0.1% to about 15% fructose corrosion inhibitor, and optionally one or more of the following components:
   an organic-hydroxyl-containing co-solvent;
   a chelating or metal complexing agent;
   an other metal corrosion-inhibiting agent; and
   a surfactant;
   wherein the wt percentages are based on the total weight of the cleaning composition.

2. A process for cleaning photoresist, post etch and ash, sacrificial light absorbing materials or anti-reflective coatings from a microelectronic substrate, the process comprising contacting the substrate with a cleaning composition for a time sufficient to clean the photoresist or residue from the substrate, wherein the cleaning composition is a composition of claim 1.

3. A process according to claim 2 wherein the microelectronic substrate to be cleaned is characterized by the presence of copper metallization.

4. A non-aqueous cleaning composition for cleaning photoresist, post etch and ash, sacrificial light absorbing materials or anti-reflective coatings from microelectronic substrates, said cleaning composition comprising:

from about 70 wt % to about 95 wt % of organic polar solvent which is a mixture of dimethylacetamide and dimethyl sulfoxide, from about 1 wt % to about 15 wt % of an organic hydroxylated amine selected from the group consisting of diethanolamine and 1-amino-2-propanol, a corrosion-inhibiting amount of from about 0.1% to about 15% fructose corrosion inhibitor, and optionally one or more of the following components:

an organic-hydroxyl-containing co-solvent;

a chelating or metal complexing agent;

an other metal corrosion-inhibiting agent; and a surfactant;

wherein the wt percentages are based on the total weight of the cleaning composition.

5. A process for cleaning photoresist, post etch and ash, sacrificial light absorbing materials or anti-reflective coatings from a microelectronic substrate, the process comprising contacting the substrate with a cleaning composition for a time sufficient to clean the photoresist or residue from the substrate, wherein the cleaning composition is a composition of claim 4.

6. A process according to claim 5 wherein the microelectronic substrate to be cleaned is characterized by the presence of copper metallization.

* * * * *